United States Patent
Mori et al.

(10) Patent No.: US 8,018,515 B2
(45) Date of Patent: Sep. 13, 2011

(54) SOLID-STATE IMAGE PICKUP DEVICE

(75) Inventors: Harumichi Mori, Hamamatsu (JP); Kazuki Fujita, Hamamatsu (JP); Ryuji Kyushima, Hamamatsu (JP); Masahiko Honda, Hamamatsu (JP); Seiichiro Mizuno, Hamamatsu (JP)

(73) Assignee: Hamamatsu Photonics K.K., Hamamatsu-shi, Shizuoka (JP)

( * ) Notice: Subject to any disclaimer, the term of this patent is extended or adjusted under 35 U.S.C. 154(b) by 245 days.

(21) Appl. No.: 11/883,757

(22) PCT Filed: Feb. 2, 2006

(86) PCT No.: PCT/JP2006/301779
§ 371 (c)(1),
(2), (4) Date: Apr. 29, 2008

(87) PCT Pub. No.: WO2006/082896
PCT Pub. Date: Aug. 10, 2006

(65) Prior Publication Data
US 2008/0192134 A1 Aug. 14, 2008

(30) Foreign Application Priority Data
Feb. 7, 2005 (JP) ................. 2005-030804

(51) Int. Cl.
*H04N 3/14* (2006.01)
*H04N 5/335* (2006.01)
(52) U.S. Cl. ...................... 348/308; 348/302
(58) Field of Classification Search .......... 348/302–310, 348/238–256, 387, 396
See application file for complete search history.

(56) References Cited

U.S. PATENT DOCUMENTS

| | | | |
|---|---|---|---|
| 5,329,112 A | 7/1994 | Mihara | |
| 6,150,183 A * | 11/2000 | Fukuda et al. | 438/3 |
| 6,255,680 B1 | 7/2001 | Nakashiba | |
| 6,590,611 B1 * | 7/2003 | Ishida et al. | 348/310 |
| 6,730,897 B2 | 5/2004 | Guidash | |
| 6,852,591 B2 * | 2/2005 | Rhodes | 438/244 |
| 6,963,372 B1 * | 11/2005 | Hiyama et al. | 348/302 |
| 2002/0117690 A1 | 8/2002 | Rhodes | |
| 2003/0122169 A1 | 7/2003 | Han et al. | |
| 2004/0251398 A1 * | 12/2004 | Mouli et al. | 250/214.1 |

(Continued)

FOREIGN PATENT DOCUMENTS

EP    1 223 746    7/2002

(Continued)

*Primary Examiner* — Tuan Ho
*Assistant Examiner* — Mark Monk
(74) *Attorney, Agent, or Firm* — Drinker Biddle & Reath LLP

(57) ABSTRACT

There is provided a solid-state imaging device with an improved linearity as well as dynamic range. Each pixel portion $P_{m,n}$ in the solid-state imaging device includes: a buried photodiode PD for generating charges of an amount corresponding to the intensity of incident light; a capacitive element C connected in parallel to the buried photodiode PD to accumulate charges generated in the buried photodiode PD; an amplifying transistor $T_1$ for outputting a voltage value corresponding to a voltage value input to the gate terminal; a transferring transistor $T_2$ for inputting a voltage value corresponding to the amount of accumulated charges in the capacitive element C to the gate terminal of the amplifying transistor $T_1$; a discharging transistor $T_3$ for discharging the charges of the capacitive element C; and a selecting transistor $T_4$ for selectively outputting a voltage value output from the amplifying transistor $T_1$ to a wiring $L_n$.

12 Claims, 6 Drawing Sheets

U.S. PATENT DOCUMENTS

2005/0006720 A1    1/2005    Ejiri et al.

FOREIGN PATENT DOCUMENTS

| | | |
|---|---|---|
| FR | 2820883 A1 | 8/2002 |
| JP | 61-39569 | 2/1986 |
| JP | 61-204966 | 9/1986 |
| JP | 63-53968 | 3/1988 |
| JP | 11-274454 | 10/1999 |
| JP | 2000-224495 | 8/2000 |
| JP | 2002-217396 | 8/2002 |
| JP | 2002-305688 | 10/2002 |
| JP | 2003-101006 | 4/2003 |

* cited by examiner (a)

(b)

(c)

SOLID-STATE IMAGE PICKUP DEVICE

TECHNICAL FIELD

The present invention relates to solid-state imaging devices in which multiple pixel portions are arranged one- or two-dimensionally.

BACKGROUND ART

Solid-state imaging devices include multiple pixel portions arranged one- or two-dimensionally in a photodetecting section, each pixel portion being provided with a photoelectric converting element. Photodiodes are commonly used as photoelectric converting elements. In photodiodes having a normal pn-junction structure, charges generated due to incidence of light are accumulated in a junction capacitor. For this reason, when a certain bias voltage is applied to a general photodiode and then shut off for incidence of light, the capacitance of the junction capacitor fluctuates depending on the amount of accumulated charge, resulting in a fluctuation in the output voltage. That is, in the relationship: Q (accumulated charge amount)=C (junction capacitance)×V (output voltage) that is known to be true, since the junction capacitance C varies depending on the change in the accumulated charge amount Q, the output voltage V does not become linear to the accumulated charge amount.

There have been known such buried photodiodes as those disclosed in Patent Document 1 that are capable of solving the problem above. In exemplary buried photodiodes, an n$^-$-type second semiconductor region is formed on a p-type first semiconductor region and a p$^+$-type third semiconductor region is formed on the second semiconductor region and the periphery thereof, and pn-junctions are formed between the first and second semiconductor regions as well as the second and third semiconductor regions. In such buried photodiodes, the second semiconductor region can be depleted completely so that the junction capacitance does not depend on the voltage and that the junction capacitance is reduced, whereby the output voltage becomes linear to the accumulated charge amount. Thus, charges generated in the pn-junctions can be readout almost completely, and since the depletion layer cannot come into contact with the interface between the semiconductor region and an insulating film region that is generally provided on the semiconductor region, the generation of leak current at the interface between the semiconductor region and the insulating film region is suppressed, resulting in an improved S/N ratio and/or linearity for light detection.

Patent Document 1: Japanese Published Unexamined Patent Application No. 11-274454

DISCLOSURE OF THE INVENTION

Problem to be Solved by the Invention

However, buried photodiodes suffer from a problem that complete depletion reduces the junction capacitance to cause charges to be saturated in a short time, restricting the expansion of the dynamic range.

The present invention has been made to solve the above-described problem, and an object thereof is to provide a solid-state imaging device with an improved linearity as well as dynamic range.

Means for Solving the Problem

The present invention is directed to a solid-state imaging device in which a plurality of pixel portions are arranged one- or two-dimensionally, wherein the plurality of pixel portions each include: a buried photodiode for generating charges of an amount corresponding to the intensity of incident light; and a capacitive element connected in parallel to the buried photodiode to accumulate charges generated in the buried photodiode. In accordance with the present invention, charges generated with incidence of light in a buried photodiode PD are accumulated in a capacitive element C provided in parallel to the buried photodiode PD. Then, a voltage value corresponding to the amount of charges accumulated in the capacitive element C is output. This can improve both the linearity and dynamic range of the solid-state imaging device.

It is also preferable that the capacitive element be formed above the buried photodiode and include a pair of transparent electrode layers and a transparent dielectric layer provided between the pair of electrode layers, and that the buried photodiode be adapted to detect light incident through the capacitive element. In this case, since the buried photodiode PD can detect light incident through the capacitive element C, the layout area of each pixel portion $P_{m,n}$ can be reduced. Alternatively, the photodetecting area and sensitivity of the buried photodiode PD can be ensured while restricting the increase in the layout area of each pixel portion $P_{m,n}$.

It is further preferable that the plurality of pixel portions each further include: an amplifying transistor for outputting a voltage value corresponding to a voltage value input to the gate terminal; a transferring transistor for inputting a voltage value corresponding to the amount of accumulated charges in the capacitive element to the gate terminal of the amplifying transistor; a discharging transistor for discharging the charges of the capacitive element; and a selecting transistor for selectively outputting a voltage value output from the amplifying transistor.

Also, the solid-state imaging device according to the present invention preferably further includes: a wiring connected from a plurality of pixel portions included in one pixel column to the output of the selecting transistor; a first holding section connected to the wiring to hold light signal components output from each pixel portion during a first period of time; a second holding section connected to the wiring to hold dark signal components output from each pixel portion during a second period of time; and a difference operating section for receiving outputs from the first and second holding sections to output the difference between the received signals. In this case, dark signal components are eliminated and thereby the S/N ratio is improved.

EFFECT OF THE INVENTION

In accordance with the solid-state imaging device according to the present invention, both the linearity and dynamic range can be improved.

DESCRIPTION OF SYMBOLS

Figure 1:
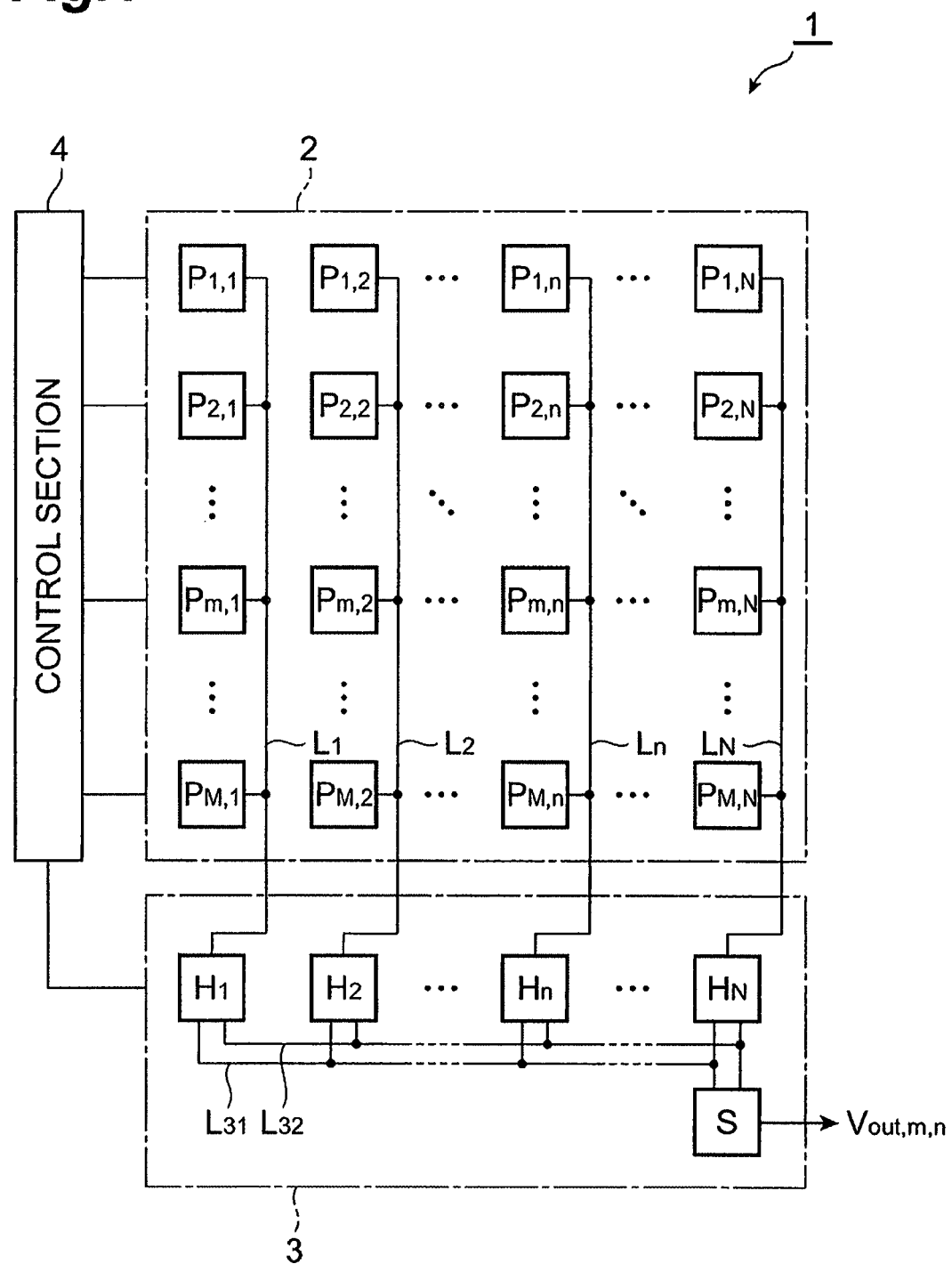
FIG. 1 is an overall block diagram of a solid-state imaging device 1 according to an embodiment.

1: Solid-state imaging device
2: Photodetecting section
3: Readout section
4: Control section
$P_{m,n}$: Pixel portion
$H_n$: Voltage holding section
S: Difference operating section

BEST MODE FOR CARRYING OUT THE INVENTION

The best mode for carrying out the present invention will hereinafter be described in detail with reference to the accompanying drawings. It is noted that in the descriptions of the drawings, identical components are designated with the same reference numerals to omit overlapping description.

FIG. 1 is an overall block diagram of a solid-state imaging device 1 according to an embodiment. The solid-state imaging device 1 shown in this drawing includes a photodetecting section 2, a readout section 3, and a control section 4. These components are formed on a common semiconductor substrate.

The photodetecting section 2 has M×N pixel portions $P_{1,1}$ to $P_{M,N}$ arranged in a two-dimensional array with M rows and N columns. Each pixel portion $P_{m,n}$ is positioned at the m-th row and the n-th column. Here, M and N each represent an integer of 2 or more, "m" represents any integer equal to or greater than 1 but equal to or smaller than M, and "n" represents any integer equal to or greater than 1 but equal to or smaller than N. Each pixel portion $P_{m,n}$ has a common composition of an APS (Active Pixel Sensor) type including a buried photodiode, etc., and is adapted to output a voltage value corresponding to the intensity of light incident to the photodiode to a wiring $L_n$. The wiring $L_n$ is connected in common to the output terminals of the M pixel portions $P_{1,n}$ to $P_{M,n}$ in the n-th column.

The readout section 3 is connected to the photodetecting section 2 via N wirings $L_1$ to $L_N$ and is adapted to receive voltage values output from each pixel portion $P_{m,n}$ to the wiring $L_n$ for predetermined processing and then to output voltage values $V_{out,m,n}$ sequentially that indicate the intensity of light incident to each pixel portion $P_{m,n}$. The readout section 3 includes N voltage holding sections $H_1$ to $H_N$ and a difference operating section S. Each voltage holding section $H_n$ is connected to the output terminals of the M pixel portions $P_{1,n}$ to $P_{M,n}$ in the n-th column via the wiring $L_n$ and is adapted to receive and hold two kinds of voltage values $V_{m,n,1}$ and $V_{m,n,2}$ output sequentially from each pixel portion $P_{m,n}$ to the wiring $L_n$. The difference operating section S is connected to the output terminal of each voltage holding section $H_n$ via two wirings $L_{31}$ and $L_{32}$ and is adapted to receive two kinds of voltage values $V_{m,n,1}$ and $V_{m,n,2}$ output sequentially from each voltage holding section $H_n$ to the respective wirings $L_{31}$ and $L_{32}$ and then to carry out a difference operation "$V_{m,n,1}-V_{m,n,2}$" to output a voltage value $V_{out,m,n}$ that indicates the result of the operation.

The control section 4 is adapted to control the operations of the photodetecting section 2 and the readout section 3. In the control section 4, various control signals are generated at predetermined timings in, for example, a shift register circuit and the control signals are sent to the photodetecting section 2 and the readout section 3. It is noted that wirings for sending control signals are simplified in FIG. 1.

Figure 2:
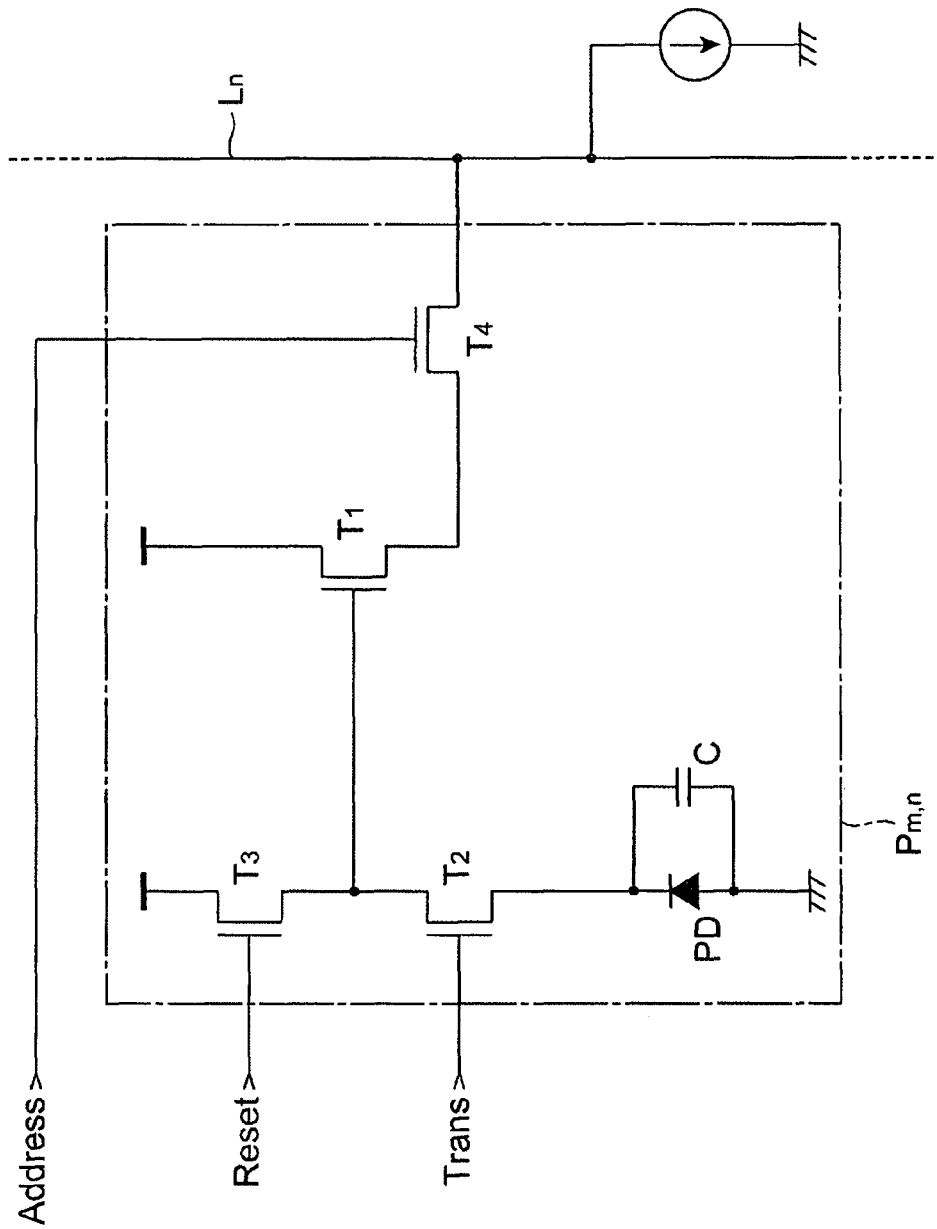
FIG. 2 is a circuit diagram of each pixel portion $P_{m,n}$.

FIG. 2 is a circuit diagram of each pixel portion $P_{m,n}$. Each pixel portion $P_{m,n}$ includes: a buried photodiode PD for generating charges of an amount corresponding to the intensity of incident light; a capacitive element C connected in parallel to the buried photodiode PD to accumulate charges generated in the buried photodiode PD; an amplifying transistor $T_1$ for outputting a voltage value corresponding to a voltage value input to the gate terminal; a transferring transistor $T_2$ for inputting a voltage value corresponding to the amount of accumulated charges in the capacitive element C to the gate terminal of the amplifying transistor $T_1$; a discharging transistor $T_3$ for discharging the charges of the capacitive element C; and a selecting transistor $T_4$ for selectively outputting a voltage value output from the amplifying transistor $T_1$ to the wiring $L_n$.

In comparison with conventional APS type arrangements, the pixel portion $P_{m,n}$ is characterized in that the capacitive element C is provided in parallel to the buried photodiode PD. In conventional APS type pixel portions, the junction capacitor of the photodiode is provided equivalently in parallel to the photodiode. Meanwhile, in each pixel portion $P_{m,n}$ in the solid-state imaging device 1 according to the present embodiment, the capacitive element C is formed intentionally separate from the junction capacitor of the buried photodiode PD.

The drain terminal of the amplifying transistor $T_1$ is at a bias potential. The drain terminal of the transferring transistor $T_2$ is connected to the gate terminal of the amplifying transistor $T_1$, while the source terminal of the transferring transistor $T_2$ is connected to the cathode of the photodiode PD and one end of the capacitive element C. The anode of the photodiode PD and the other end of the capacitive element C are connected to a ground potential. The source terminal of the discharging transistor $T_3$ is connected to the gate terminal of the amplifying transistor $T_1$, while the drain terminal of the discharging transistor $T_3$ is at the bias potential. The source terminal of the selecting transistor $T_4$ is connected to the source terminal of the amplifying transistor $T_1$, while the drain terminal of the selecting transistor $T_4$ is connected to the wiring $L_n$. Also, the wiring $L_n$ is connected with a constant current source. The amplifying and selecting transistors $T_1$ and $T_4$ form a source follower circuit together with the constant current source.

A transfer control signal "Trans" is input to the gate terminal of the transferring transistor $T_2$. A discharge control signal "Reset" is input to the gate terminal of the discharging transistor $T_3$. A selection control signal "Address" is input to the gate terminal of the selecting transistor $T_4$. When the transfer control signal "Trans" is at a high level and the discharge control signal "Reset" is at a low level, the transferring transistor $T_2$ inputs a voltage value corresponding to the amount of accumulated charges in the capacitive element C to the gate terminal of the amplifying transistor $T_1$. When the transfer control signal "Trans" is at a high level and the discharge control signal "Reset" is also at a high level, the transferring and discharging transistors $T_2$ and $T_3$ discharge the charges of the capacitive element C. Also, when the selection control signal "Address" is at a high level, the selecting transistor $T_4$ outputs a voltage value output from the amplifying transistor $T_1$ to the wiring $L_n$.

In the thus arranged pixel portion $P_{m,n}$, when the transfer control signal "Trans" is at a low level and the discharge control signal "Reset" turns to a high level, the gate terminal of the amplifying transistor $T_1$ is discharged, and when the selection control signal "Address" is at a high level, a voltage value (dark signal components) output from the amplifying transistor $T_1$ in its initial state is output to the wiring $L_n$ through the selecting transistor $T_4$. On the other hand, when the discharge control signal "Reset" is at a low level and the transfer and selection control signals "Trans" and "Address" are at a high level, a voltage value corresponding to the amount of charges generated in the photodiode PD and accumulated in the capacitive element C is input to the gate terminal of the amplifying transistor $T_1$, and a voltage value (light signal components) output from the amplifying transistor $T_1$ in accordance with the input voltage value is output to the wiring $L_n$ through the selecting transistor $T_4$.

Figure 3:
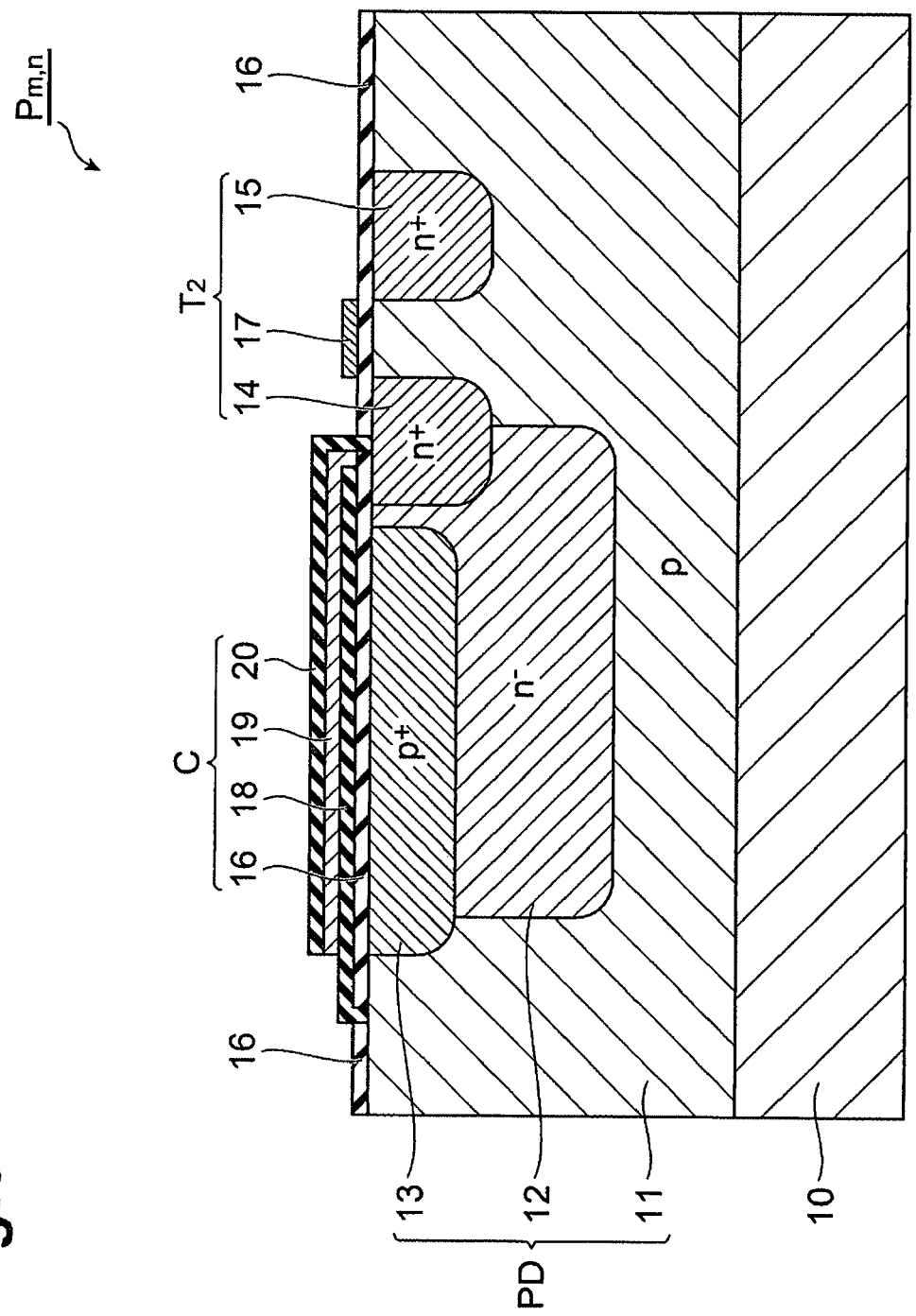
FIG. 3 is a partial cross-sectional view of each pixel portion $P_{m,n}$.

FIG. 3 is a partial cross-sectional view of each pixel portion $P_{m,n}$. This drawing shows a cross section of the buried photodiode PD, capacitive element C, and transferring transistor $T_2$. As shown in this drawing, each pixel portion $P_{m,n}$ has a p-type first semiconductor region 11, an n$^-$-type second semiconductor region 12, a p$^+$-type third semiconductor region 13, an n$^+$-type fourth semiconductor region 14, an n$^+$-type fifth semiconductor region 15, an insulating layer 16, a gate electrode layer 17, a first electrode layer 18, a dielectric layer 19, and a second electrode layer 20 that are formed on a semiconductor substrate 10.

The p$^+$-type third semiconductor region 13 and the n$^+$-type fourth semiconductor region 14 are each formed on both the p-type first semiconductor region 11 and the n$^-$-type second semiconductor region 12. The n$^+$-type fifth semiconductor region 15 is formed on the p-type first semiconductor region 11. The insulating layer 16 is formed on the almost entire body of these semiconductor layers except a part thereof. The gate electrode layer 17 is formed above the p-type first semiconductor region 11 between the n$^+$-type fourth semiconductor region 14 and the n$^+$-type fifth semiconductor region 15 and on the insulating layer 16. The first electrode layer 18, dielectric layer 19, and second electrode layer 20 are formed above the p$^+$-type third semiconductor region 13 and on the insulating layer 16 in this order. The first electrode layer 18 is connected electrically with the p-type first semiconductor region 11, and the second electrode layer 20 is connected electrically with the n$^+$-type fourth semiconductor region 14.

The buried photodiode PD is constituted by the p-type first semiconductor region 11, n$^-$-type second semiconductor region 12, and p$^+$-type third semiconductor region 13. The transferring transistor $T_2$ is constituted by the p-type first semiconductor region 11, n$^+$-type fourth semiconductor region 14, n$^+$-type fifth semiconductor region 15, and gate electrode layer 17. Also, the capacitive element C is constituted by the first electrode layer 18, dielectric layer 19, and second electrode layer 20.

It is preferable that the capacitive element C be thus formed above the buried photodiode PD and the first electrode layer 18, dielectric layer 19, and second electrode layer 20 constituting the capacitive element C be transparent. In this case, since the buried photodiode PD can detect light incident through the capacitive element C, the layout area of each pixel portion $P_{m,n}$ can be reduced. For example, the pair of electrode layers 18 and 20 are made of polysilicon, and the dielectric layer 19 between the pair of electrode layers 18 and 20 is made of quartz glass (SiO$_2$).

Figure 4:
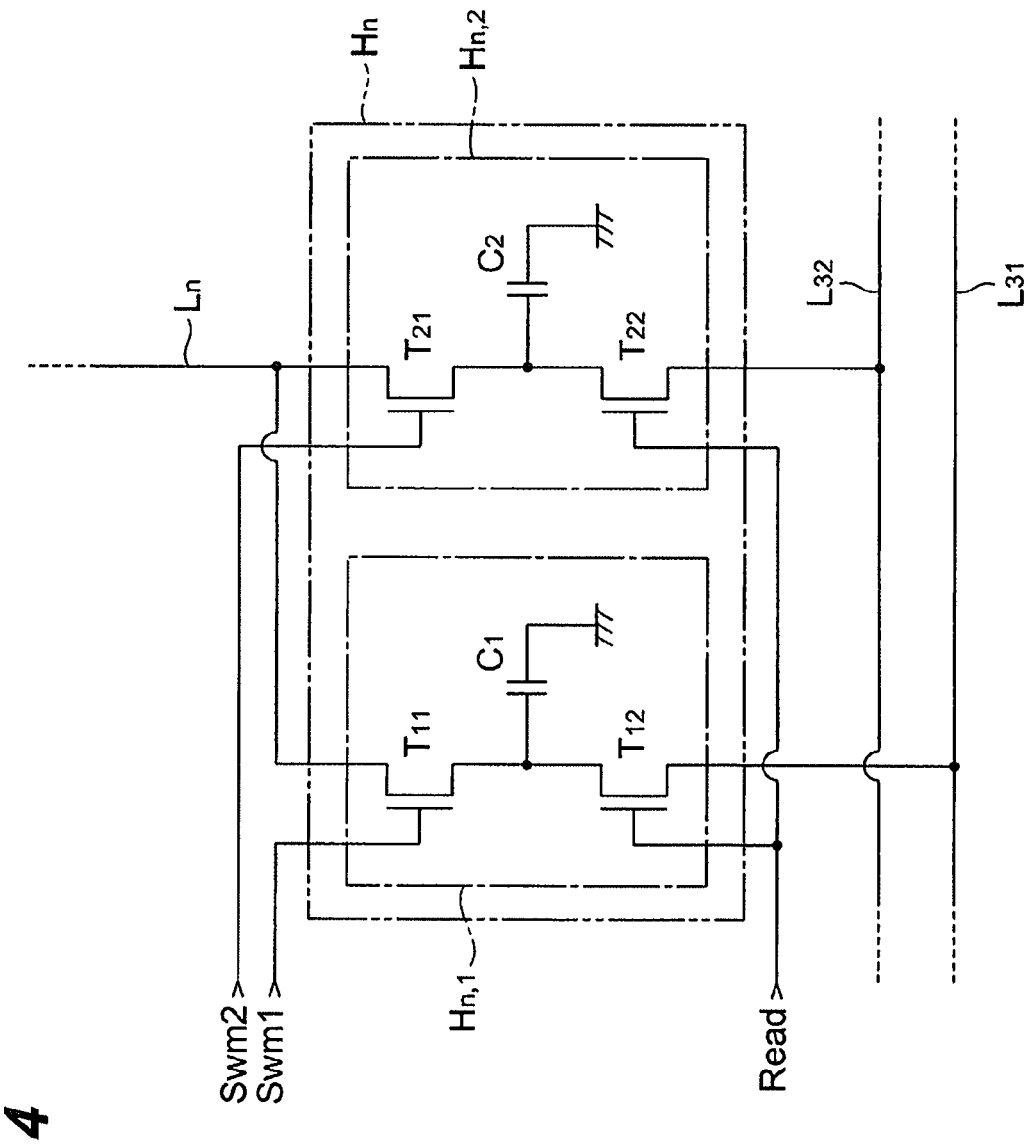
FIG. 4 is a circuit diagram of each voltage holding section $H_n$.

FIG. 4 is a circuit diagram of each voltage holding section $H_n$. As shown in this drawing, each voltage holding section $H_n$ includes first and second holding sections $H_{n,1}$ and $H_{n,2}$. The first and second holding sections $H_{n,1}$ and $H_{n,2}$, which have the same composition, can receive and hold voltage values output sequentially from the selecting transistors $T_4$ in the M pixel portions $P_{1,n}$ to $P_{M,n}$ in the n-th column and output the held voltage values.

The first holding section $H_{n,1}$ includes transistors $T_{11}$ and $T_{12}$ and a capacitive element $C_1$. One end of the capacitive element $C_1$ is connected to the ground potential, while the other end of the capacitive element $C_1$ is connected to the drain terminal of the transistor $T_{11}$ and the source terminal of the transistor $T_{12}$. The source terminal of the transistor $T_{11}$ is connected to the selecting transistor $T_4$ in the pixel portion $P_{m,n}$ via the wiring $L_n$. The drain terminal of the transistor $T_{12}$ is connected to the wiring $L_{31}$. In the thus arranged first holding section $H_{n,1}$, when a first input control signal $S_{wm1}$ input to the gate terminal of the transistor $T_{11}$ is at a high level, a voltage value output from the pixel portion $P_{m,n}$ that is connected via the wiring $L_n$ is held in the capacitive element $C_1$, and when an output control signal "Read" input to the gate terminal of the transistor $T_{12}$ is at a high level, the voltage value $V_{m,n,1}$ held in the capacitive element $C_1$ is output to the wiring $L_{31}$.

The second holding section $H_{n,2}$ includes transistors $T_{21}$ and $T_{22}$ and a capacitive element $C_2$. One end of the capacitive element $C_2$ is connected to the ground potential, while the other end of the capacitive element $C_2$ is connected to the drain terminal of the transistor $T_{21}$ and the source terminal of the transistor $T_{22}$. The source terminal of the transistor $T_{21}$ is connected to the selecting transistor $T_4$ in the pixel portion $P_{m,n}$ via the wiring $L_n$. The drain terminal of the transistor $T_{22}$ is connected to the wiring $L_{32}$. In the thus arranged second holding section $H_{n,2}$, when a second input control signal $S_{wm2}$ input to the gate terminal of the transistor $T_{21}$ is at a high level, a voltage value output from the pixel portion $P_{m,n}$ that is connected via the wiring $L_n$ is held in the capacitive element $C_2$, and when an output control signal "Read" input to the gate terminal of the transistor $T_{22}$ is at a high level, the voltage value $V_{m,n,2}$ held in the capacitive element $C_2$ is output to the wiring $L_{32}$.

The first and second holding sections $H_{n,1}$ and $H_{n,2}$ operate at timings different from each other. For example, the second holding section $H_{n,2}$ receives and holds the voltage value (dark signal components) $V_{m,n,2}$ output from the amplifying transistor $T_1$ when the transfer control signal "Trans" is at a low level and the discharge and selection control signals "Reset" and "Address" are at a high level in the pixel portion $P_{m,n}$ that is connected via the wiring $L_n$. Meanwhile, the first holding section $H_{n,1}$ receives and holds the voltage value (light signal components) $V_{m,n,1}$ output from the amplifying transistor $T_1$ when the discharge control signal "Reset" is at a low level and the transfer and selection control signals "Trans" and "Address" are at a high level in the pixel portion $P_{m,n}$ that is connected via the wiring $L_n$.

It is noted that the transfer control signal "Trans", discharge control signal "Reset", selection control signal "Address", first input control signal $S_{wm1}$, second input control signal $S_{wm2}$, and output control signal "Read" are output from the control section 4.

Figure 5:
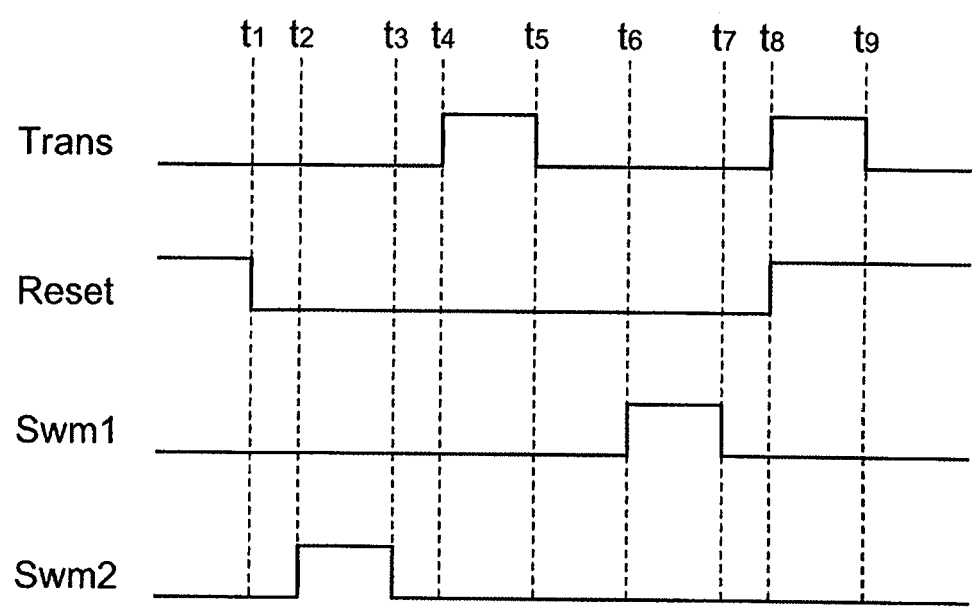
FIG. 5 is a timing chart illustrating the operation of the solid-state imaging device 1 according to the embodiment.

FIG. 5 is a timing chart illustrating the operation of the solid-state imaging device 1 according to the present embodiment. It is noted that although the operation of one pixel portion $P_{m,n}$ will hereinafter be described, voltage values $V_{out,1,1}$ to $V_{out,M,N}$ corresponding to the intensity of incident light for the respective M×N pixel portions $P_1$, to $P_{M,N}$ are actually output sequentially from the readout section 3 by the selection control signal "Address" input to the gate terminal of the selecting transistor $T_4$ in each pixel portion $P_{m,n}$ and the output control signal "Read" input to the gate terminals of the transistors $T_{12}$ and $T_{22}$ in each voltage holding section $H_n$.

FIG. 5 shows the level changes of the transfer control signal "Trans" input to the gate terminal of the transferring transistor $T_2$ in the pixel portion $P_{m,n}$, the discharge control signal "Reset" input to the gate terminal of the discharging transistor $T_3$ in the pixel portion $P_{m,n}$, the first input control signal $S_{wm1}$ input to the gate terminal of the transistor $T_{11}$ in the first holding section $H_{n,1}$, and the second input control signal $S_{wm2}$ input to the gate terminal of the transistor $T_{12}$ in the second holding section $H_{n,2}$ in this order from above. It is noted that the selection control signal "Address" input to the gate terminal of the selecting transistor $T_4$ in each pixel portion $P_{m,n}$ is kept at a high level while the voltage value $V_{out,m,n}$ corresponding to the intensity of light incident to the pixel portion $P_{m,n}$ is output from the readout section 3.

Before the time $t_1$, the transfer control signal "Trans" is at a low level, the discharge control signal "Reset" is at a high level, and the first and second input control signals $S_{wm1}$ and $S_{wm2}$ are at a low level. The discharge control signal "Reset" is made low at the time $t_1$. Then, the second input control signal $S_{wm2}$ is made high at the time $t_2$ and then made low at the time $t_3$. The voltage value (dark signal components) $V_{m,n,2}$ output from the amplifying transistor $T_1$ in the pixel portion $P_{m,n}$ is held in the capacitive element $C_2$ in the second holding section $H_{n,2}$ during the time between $t_2$ and $t_3$ where the second input control signal $S_{wm2}$ is at a high level.

Subsequently, the transfer control signal "Trans" is made high at the time $t_4$ and then made low at the time $t_5$. This causes a voltage value corresponding to the amount of charges generated in the photodiode PD and accumulated in the capacitive element C to be input to the gate terminal of the amplifying transistor $T_1$. Next, the first input control signal $S_{wm1}$ is made high at the time $t_6$ and then made low at the time $t_7$. The voltage value (light signal components) $V_{m,n,1}$ output from the amplifying transistor $T_1$ in the pixel portion $P_{m,n}$ is held in the capacitive element $C_1$ in the first holding section $H_{n,1}$ during the time between $t_6$ and $t_7$ where the first input control signal $S_{wm1}$ is at a high level.

Then, the transfer control signal "Trans" is made high at the time $t_8$ and then made low at the time $t_9$. The discharge control signal "Reset" is made high at the time $t_8$. This causes the charges of the capacitive element C to be discharged.

After the time $t_7$, the output control signal "Read" is made high during a certain period of time. During this period of time, the voltage value (light signal components) $V_{m,n,1}$ held in the capacitive element $C_1$ in the first holding section $H_{n,1}$ is output to the wiring $L_{31}$, and the voltage value (dark signal components) $V_{m,n,2}$ held in the capacitive element $C_2$ in the second holding section $H_{n,2}$ is output to the wiring $L_{32}$. Then, the difference operating section S receives the voltage values $V_{m,n,1}$ and $V_{m,n,2}$ and then carries out a difference operation "$V_{m,n,1} - V_{m,n,2}$" to output a voltage value $V_{out,m,n}$ that indicates the result of the operation. The voltage value $V_{out,m,n}$ thus output from the readout section 3 corresponds to the intensity of light incident to the implanted photodiode PD in the pixel portion $P_{m,n}$, in which dark signal components are eliminated and thereby the S/N ratio is improved.

In the present embodiment, charges generated with incidence of light in the buried photodiode PD are accumulated in the capacitive element C that is provided in parallel to the buried photodiode PD. Then, a voltage value $V_{m,n,1}$ corresponding to the amount of charges accumulated in the capacitive element C is output to the wiring $L_n$ through the selecting transistor $T_4$. Since the buried photodiode PD is thus used, the second semiconductor region 12 can be depleted completely so that the junction capacitance is reduced and charges generated in the pn-junctions can be readout almost completely, whereby the generation of leak current is suppressed, resulting in an improved S/N ratio and/or linearity for light detection. In addition, since the capacitive element C is formed in parallel to the buried photodiode PD and charges generated in the buried photodiode PD are accumulated in the capacitive element C, the problem that charges may be saturated in the junction capacitor of the buried photodiode can be solved and thereby the dynamic range can be increased. Thus, the solid-state imaging device 1 has an improved linearity as well as dynamic range.

Also, in the present embodiment, the capacitive element C is formed above the buried photodiode PD and the first electrode layer 18, dielectric layer 19, and second electrode layer 20 constituting the capacitive element C are transparent. This allows the buried photodiode PD to detect light incident through the capacitive element C, whereby the layout area of each pixel portion $P_{m,n}$ can be reduced. Alternatively, the photodetecting area and sensitivity of the implanted photodiode PD can be ensured while restricting the increase in the layout area of each pixel portion $P_{m,n}$.

Figure 6:
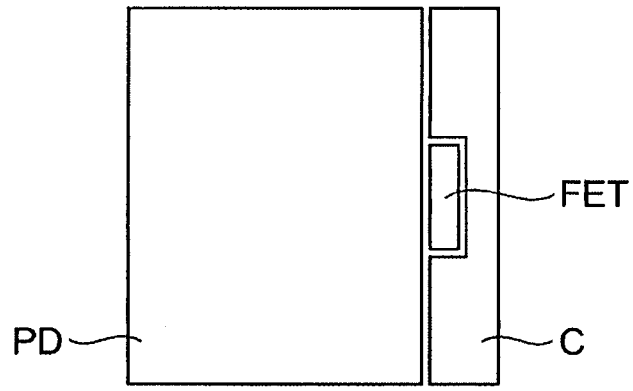
FIG. 6-(a), FIG. 6-(b) and FIG. 6-(c) are plan views schematically showing the layout of each pixel portion $P_{m,n}$ in other embodiments.
Figure 6:
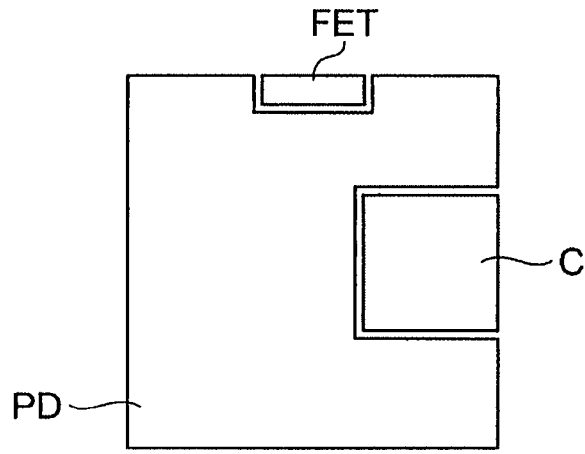
Figure 6:
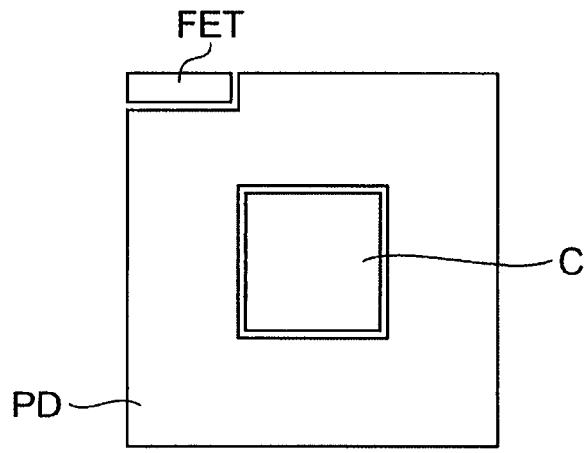

The present invention is not restricted to the above-described embodiment, and various modifications may be made. For example, the layout of the buried photodiode PD, capacitive element C, and transistors $T_1$ to $T_4$ in each pixel portion $P_{m,n}$ is not restricted to that in the above-described embodiment. FIG. 6 shows plan views schematically showing the layout of each pixel portion $P_{m,n}$ in other embodiments. In this drawing, the reference "FET" denotes an area where the transistors $T_1$ to $T_4$ are arranged. In the layouts shown in FIG. 6-(a), FIG. 6-(b), and FIG. 6-(c), the arrangement areas of the implanted photodiode PD and the capacitive element C are separated from each other.

In the layout shown in FIG. 6-(a), the arrangement area of the transistors $T_1$ to $T_4$ is surrounded by the arrangement areas of the buried photodiode PD and the capacitive element C. In the layout shown in FIG. 6-(b), the arrangement areas of the transistors $T_1$ to $T_4$ and the capacitive element C are on the outside of the arrangement area of the buried photodiode PD. In the layout shown in FIG. 6-(c), the arrangement area of the transistors $T_1$ to $T_4$ is on the outside of the arrangement area of the buried photodiode PD, while the arrangement area of the capacitive element C is surrounded by the arrangement area of the buried photodiode PD. In these cases, the capacitive element may not be transparent, but employing a transparent capacitive element allows light passing through the capacitive element to generate charges in the semiconductor region corresponding to the arrangement area of the capacitive element and then the charges to be diffused and captured in the arrangement area of the buried photodiode PD, resulting in a further improvement in efficiency.

INDUSTRIAL APPLICABILITY

The present invention is applicable to solid-state imaging devices.

The invention claimed is:

1. A solid-state imaging device in which a plurality of pixel portions are arranged one- or two-dimensionally, wherein the plurality of pixel portions each comprise:
   a buried photodiode for generating charges of an amount corresponding to the intensity of incident light;
   a capacitive element connected in parallel to the buried photodiode to accumulate charges generated in the buried photodiode; and
   a transferring transistor connected to the buried photodiode;
   wherein said buried photodiode includes:
      a first semiconductor region of first conductivity type;
      a second semiconductor region of second conductivity type, the second semiconductor region being formed in the first semiconductor region;

a third semiconductor region of first conductivity type, the third semiconductor region being formed on the second semiconductor region; and a fourth semiconductor region of second conductivity type, the fourth semiconductor region being in contact with the second semiconductor region, the fourth semiconductor region being isolated from the third semiconductor region, wherein the transferring transistor includes:

the fourth semiconductor region as a source terminal of the transferring transistor; and a fifth semiconductor region of second conductivity type as a drain terminal of the transferring transistor, and wherein the third semiconductor region and the fourth semiconductor region are formed on the second semiconductor region.

2. The solid-state imaging device according to claim 1, wherein the capacitive element is formed above the buried photodiode and includes a pair of transparent electrode layers and a transparent dielectric layer provided between the pair of electrode layers, and wherein the buried photodiode is adapted to detect light incident through the capacitive element.

3. The solid-state imaging device according to claim 1, wherein the plurality of pixel portions each further comprise:

an amplifying transistor for outputting a voltage value corresponding to a voltage value input to a gate terminal of the amplifying transistor;

the transferring transistor for inputting a voltage value corresponding to the amount of accumulated charges in the capacitive element to the gate terminal of the amplifying transistor;

a discharging transistor for discharging the charges of the capacitive element; and a selecting transistor for selectively outputting a voltage value output from the amplifying transistor.

4. The solid-state imaging device according to claim 3, further comprising:

a wiring connected from a plurality of pixel portions included in one pixel column to the output of the selecting transistor;

a first holding section connected to the wiring to hold light signal components output from each pixel portion during a first period of time;

a second holding section connected to the wiring to hold dark signal components output from each pixel portion during a second period of time; and a difference operating section for receiving outputs from the first and second holding sections to output the difference between the received signals.

5. The solid-state imaging device according to claim 1, wherein the fourth semiconductor region is in contact with the first semiconductor region.

6. The solid-state imaging device according to claim 5, wherein the fifth semiconductor region is formed in the first semiconductor region.

7. The solid-state imaging device according to claim 6, wherein the fourth semiconductor region functions as:

a cathode of the photodiode;

the source terminal of the transferring transistor, and one end of the capacitor element.

8. The solid-state imaging device according to claim 7, the amplifying transistor, the transferring transistor, the discharging transistor and the selecting transistor are arranged in an area, and this area is arranged between the photodiode and the capacitor element in a plane view of the solid-state imaging device.

9. The solid-state imaging device according to any one of claims 1 to 8, wherein the first conductivity type is p-type and the second conductivity type is n-type.

10. The solid-state imaging device according to claim 1, the capacitor element comprises:

a first electrode layer;

a second electrode layer; and a dielectric layer provided between the first and second electrode layers, and wherein the second electrode layer is connected to the fourth semiconductor layer.

11. The solid-state imaging device according to claim 10, the first electrode layer is connected to the first semiconductor region.

12. A solid-state imaging device in which a plurality of pixel portions are arranged one- or two-dimensionally, wherein the plurality of pixel portions each comprise:

a buried photodiode for generating charges of an amount corresponding to the intensity of incident light;

a capacitive element connected in parallel to the buried photodiode to accumulate charges generated in the buried photodiode; and a transistor connected to the buried photodiode;

wherein said buried photodiode includes:

a first semiconductor region of first conductivity type;

a second semiconductor region of second conductivity type, the second semiconductor region being formed in the first semiconductor region;

a third semiconductor region of first conductivity type, the third semiconductor region being formed on the second semiconductor region; and a fourth semiconductor region of second conductivity type, the fourth semiconductor region being in contact with the second semiconductor region, wherein the fourth semiconductor region being isolated from the third semiconductor region, wherein the transistor includes:

the fourth semiconductor region as a source terminal of the transistor; and a fifth semiconductor region of second conductivity type as a drain terminal of the transistor, and wherein the third semiconductor region and the fourth semiconductor region are formed on the second semiconductor region.

* * * * *